(12) United States Patent
Lin et al.

(10) Patent No.: US 7,875,406 B2
(45) Date of Patent: Jan. 25, 2011

(54) MULTIPLE TECHNOLOGY NODE MASK

(75) Inventors: Feng Lung Lin, Hsinchu (TW); Kuan Liang Wu, Taipei (TW); Fei-Gwo Tsai, Hsinchu (TW); Che-Rong Liang, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 272 days.

(21) Appl. No.: 12/056,897

(22) Filed: Mar. 27, 2008

(65) Prior Publication Data
US 2009/0246975 A1 Oct. 1, 2009

(51) Int. Cl.
*G03F 1/00* (2006.01)
*G03C 5/00* (2006.01)
*H01L 21/00* (2006.01)
(52) U.S. Cl. .......................... 430/5; 430/311; 430/394
(58) Field of Classification Search .............. 430/5, 430/311, 312, 313, 394; 716/19, 20, 21
See application file for complete search history.

(56) References Cited

U.S. PATENT DOCUMENTS

| 5,995,200 | A | 11/1999 | Pierrat |
| 6,040,892 | A | 3/2000 | Pierrat |
| 6,710,851 | B1 | 3/2004 | Elmer et al. |
| 2003/0224148 | A1* | 12/2003 | Tsai et al. ................ 428/195.1 |
| 2006/0026549 | A1* | 2/2006 | Tsao et al. .................... 716/19 |

\* cited by examiner

*Primary Examiner*—Stephen Rosasco
(74) *Attorney, Agent, or Firm*—Haynes and Boone, LLP (57) ABSTRACT

A multiple technology node mask (MTM) is provided. An MTM includes a pattern associated with a first technology node and a pattern associated with a second technology node. The first technology node and the second technology node may be different. For example, the first technology node may be a main node and the second technology node a sub-node. A mask set including an MTM may also include single technology node masks (STMs) for mask layers in which the first technology node and second technology node and/or the patterns associated with each are not compatible. A single mask set including MTM and STMs, may be used to produce a plurality of devices, each on a different wafer.

20 Claims, 9 Drawing Sheets

| Test devices Node B | Test devices Node C |
|---|---|
| Small Volume Production devices | |

Fig. 7

| Test devices Node D | Test devices Node D |
|---|---|
| Test devices Node D | Test devices Node E |

Fig. 8

| Test devices Node A |
|---|
| Production devices Node A |

Fig. 6

| Production devices Node F |
|---|
| Production devices Node G |

Fig. 9

| Verify devices Node I | Verify devices Node H |
|---|---|
| Production devices Node H | |

Fig. 10

| Test Node J | Test Node K | Test Node L |
|---|---|---|
| Production devices Node M | | |

MULTIPLE TECHNOLOGY NODE MASK

BACKGROUND

The present disclosure relates generally to semiconductor fabrication, and more particularly to a photomask.

As semiconductor devices increase in complexity, the mask sets required to fabricate devices increase in complexity, number, and cost. As such, fabrication of masks for development, test, or even small volume production becomes prohibitively high. One solution to easing these costs offered by semiconductor foundry suppliers is to provide a mask "shuttle." Using a mask shuttle, it is possible for the foundry to share over multiple customers and/or products the costs of one mask set—the shuttle mask. The shuttle mask is used to produce devices for each of the multiple customers and/or products. However, the costs of a mask shuttle itself is sufficiently high such that a shuttle often can not be run very frequently, in particular, as frequently as may be desired by a customer. A shuttle for a sub-node (e.g., a node distinct from a main technology node) may have an even lower frequency.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is understood that specific embodiments are provided herein as examples to teach the broader inventive concept, and one of ordinary skill in the art can easily apply the teaching of the present disclosure to other methods or apparatus. In addition, it is understood that the methods and apparatus discussed in the present disclosure include some conventional structures and/or processes. Since these structures and processes are well known in the art, they will only be discussed in a general level of detail. Furthermore, reference numbers are repeated throughout the drawings for sake of convenience and example, and such repetition does not indicate any required combination of features or steps throughout the drawings.

In the following description of various embodiments, reference is made to several terms for which a description immediately follows. A technology node may refer to the geometry of the process (e.g., 80 nm, 90 nm, 65 nm critical dimension). A mask may be used to refer to a photomask or reticle used in photolithography process. An exposure field may refer to the portion of the mask or reticle through which radiation passes and an area of substrate exposure. Though described herein as a mask configured to fabricate semiconductor devices, any photomask may benefit from the disclosure including, for example, for TFT-LCD fabrication, and/or other photolithography processes known in the art. A mask set may refer to a group of masks each one associated with the formation of a layer, or multiple layers, of the semiconductor device, each mask referred to as a mask layer. Mask data may refer to any data prior used in designing an integrated circuit device and associated mask, prior to or post tape-out of the design. A pattern may represent any data, structure, feature on a mask or wafer, that is associated with (e.g., defines) an integrated device or portion thereof. A pattern on a mask includes any structure on a mask such that radiation when passing through is altered in some manner (e.g., by absorption, reflection, or refraction).

Figure 1A:
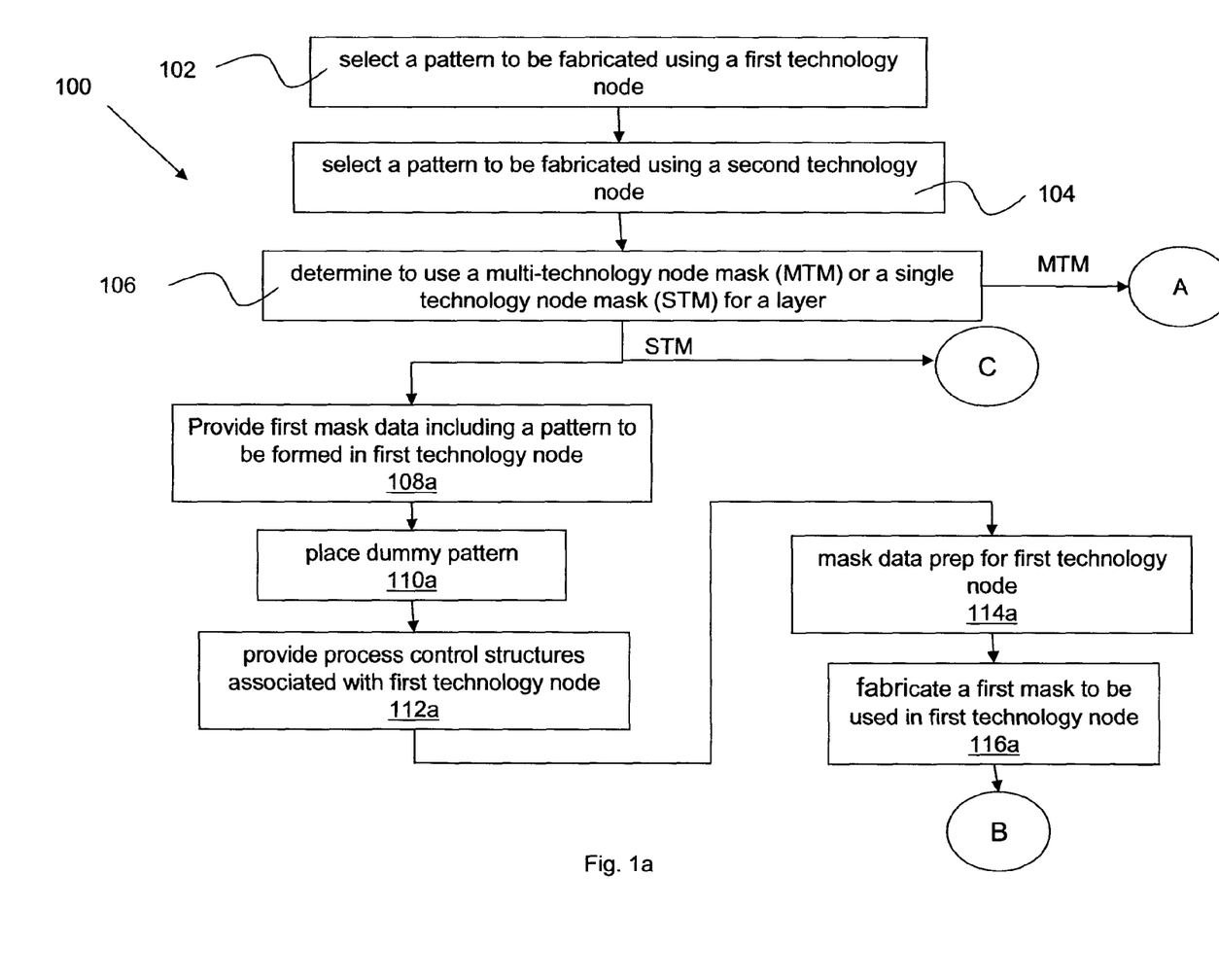
FIGS. 1a, 1b, and 1c are flowcharts illustrating an embodiment of a method of providing a mask set.
Figure 1B:
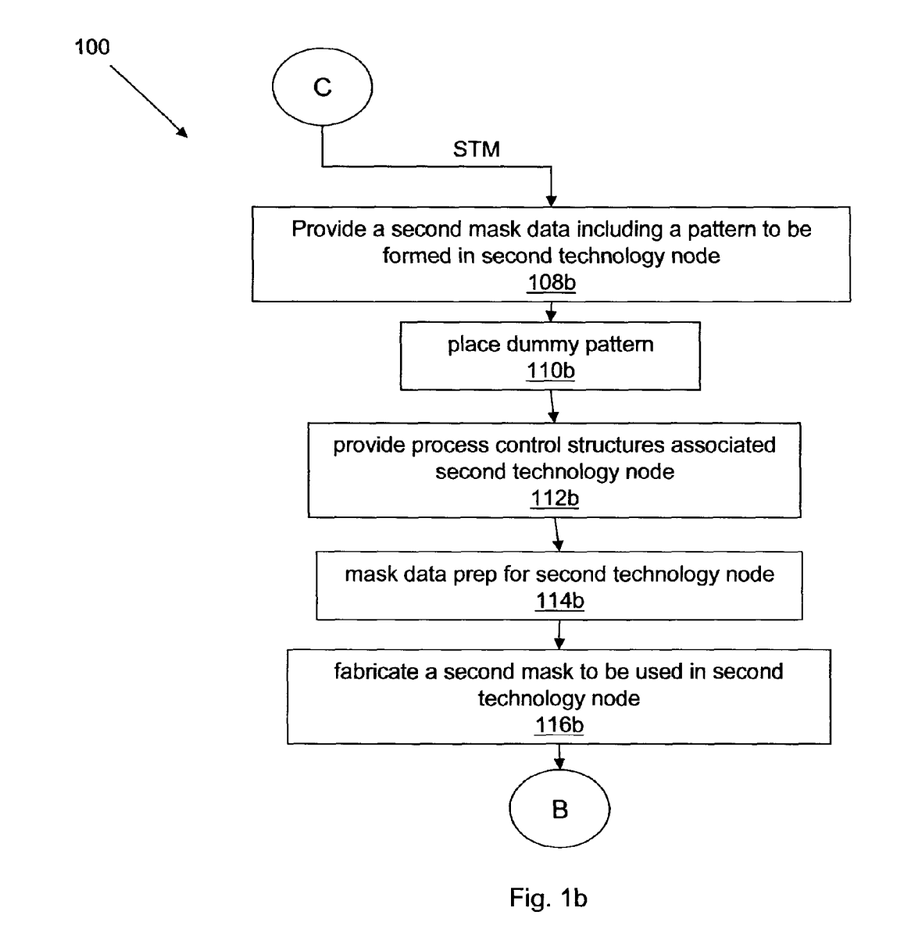
Figure 1C:
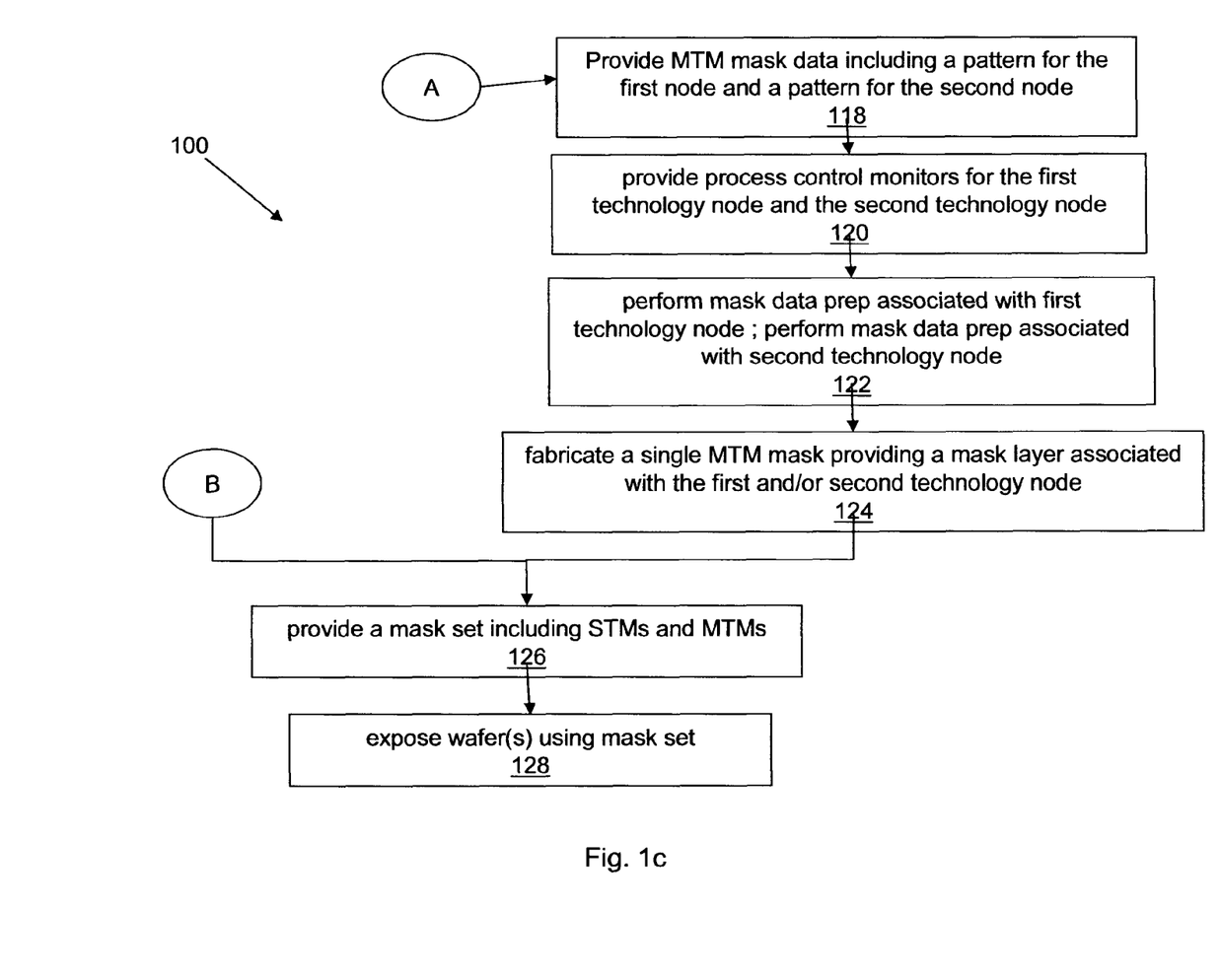

Referring to FIGS. 1a, 1b, and 1c, illustrated is an embodiment of a method 100 for forming a mask set that includes at least one multiple technology node mask (MTM). An MTM includes patterns associated with at least two different technology nodes. In other words, an MTM includes features having been designed with at least two different technology nodes and that will, respectively, provide for patterns on a substrate (e.g., semiconductor wafer) that are fabricated using at least two different technology nodes. The method 100 begins at block 102 where a pattern associated with a first technology node is determined. The pattern may correspond to an integrated circuit or portion thereof, including providing for features such as, conductive line(s) (e.g., copper interconnects), polysilicon feature(s), contact features, vias, and/or other possible features when formed on a substrate (e.g., a semiconductor wafer).

In an embodiment, the pattern is defined by a customer of a semiconductor foundry supplier. The customer may be a fabless entity and/or an integrated device manufacturer (IDM). The first technology node may include any node available for processing semiconductor devices including a main node or a sub-node. Examples of main nodes include 130 nm, 90 nm, 65 nm, 45 nm, 32 nm, 22 nm, and the like. Examples of sub-nodes include 110 nm, 80 nm, 55 nm, and the like. The pattern may include features that are to be included on one or more mask layers and/or are to be fabricated on one or more layers of the semiconductor device. The mask layers may include a layer for forming a well, an active region, a gate, a contact feature, one or more conductive interconnect layers, and/or other layers known in the art. A device requires two (2) or more mask layers. For example, a device to be fabricated using a 65 nm technology node typically uses approximately 12-20 mask layers.

The method 100 then proceeds to step 104 where a pattern associated with a second technology node is provided. The pattern may be substantially similar to the pattern provided above in step 102. The second node may be different that the first node (e.g., use a process geometry greater than or less than the first node). In an embodiment, the first node is a main node and the second node is a sub-node. In an embodiment, the pattern provided in step 104 is defined by a customer and provided to a semiconductor foundry supplier. The customer supplying the patterns of steps 102 and 104 may be the same or different entity. The patterns provided in steps 102 and 104 may define the same product (e.g., integrated circuit (IC) device) or different products. The patterns provided may be included in devices for production, verification, development, analysis, and/or other desired purposes. The provision of the first pattern and/or the second pattern may be referred to as a "tape-out" of a design. Though illustrated herein as providing two patterns, any plurality of patterns including, for example, associated with a plurality of customers, devices, and/or technology nodes may be provided.

The method 100 then proceeds to step 106 where it is determined whether to use a multiple technology node mask or a plurality of single technology node masks (STMs) to provide for the patterns of step 102 and 104. The step 106 may be repeated for each of the mask layers associated with patterns (e.g., each layer of the mask set used to form the patterns of step 102 and 104). The determination of use of STMs or a MTM for any given layer of a mask set may include analysis of the type of layer (e.g., contact, interconnect, active), the technology nodes, the reticle grade, the reticle type, other reticle properties, the tone of the mask, the mask layer, the processing parameters and/or materials associated with a technology node, and/or other suitable considerations. Examples of "rules" that may be used in determining the use of STMs or combination of a patterns onto an MTM include prohibiting combination of an interconnect (e.g., line/space) layer and a contact layer, prohibiting downgrading a layer to a larger geometry process, prohibiting mixing reticle types, prohibiting combination on a MTM of specific technology nodes, prohibiting against mixing different tone (e.g., bright tone/dark tones, positive/negative resist), prohibiting combining patterns requiring different tooling biases, prohibiting combining patterns requiring different wave length requirements for exposure, requiring the same type of mask layer be combined (e.g., a 65 nm contact layer and a 90 nm contact layer), prohibiting combination of patterns because of tool constraints, and/or other suitable combination rules. Mask layers that may not be combined to form a MTM for the layer may be referred to as non-compatible layers. Non-compatible layers may require each pattern for the non-compatible layer be formed on a separate STM.

Figure 2:
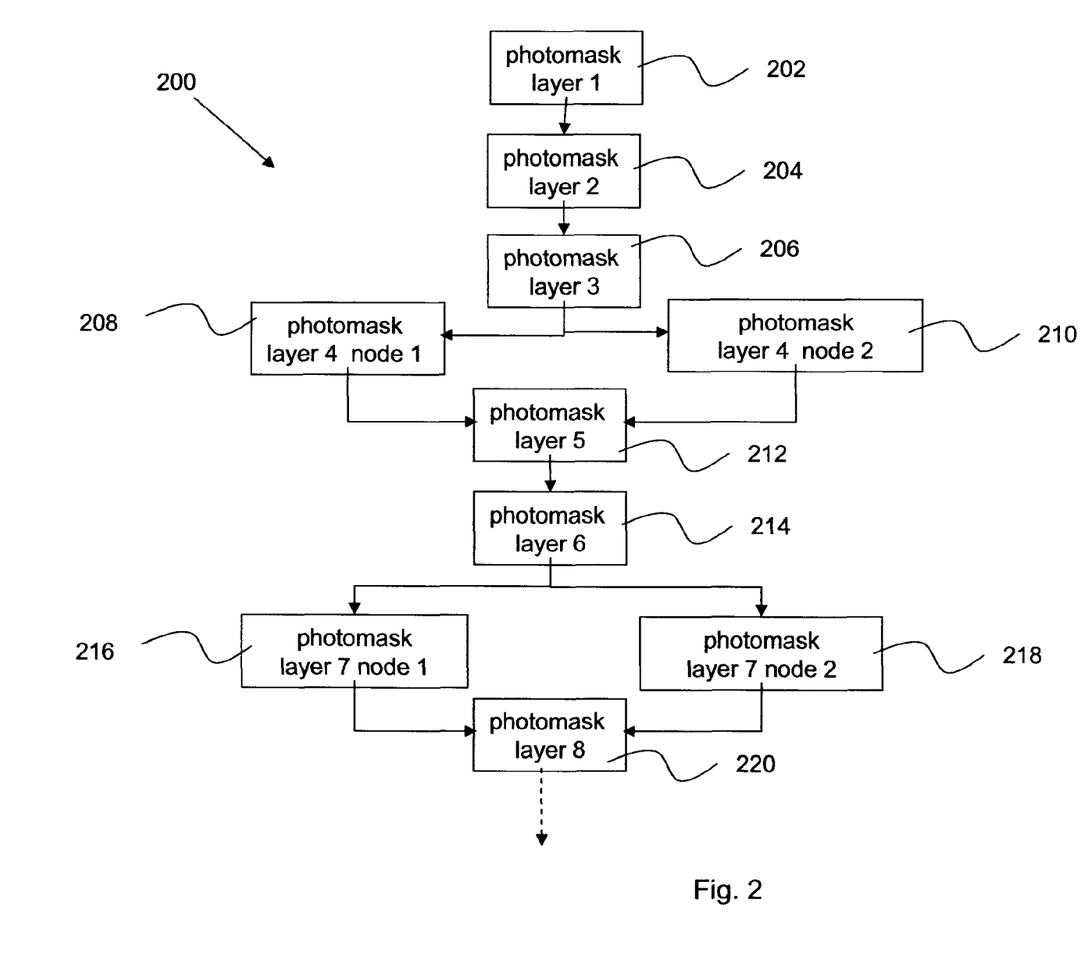
FIG. 2 is a block diagram illustrating an embodiment of a mask set.

FIG. 2 illustrates a mask set 200 including STMs and MTMs. The mask set 200 may include a first and second pattern each pattern associated with a different technology node. The mask set 200 includes a first layer mask 202, a second layer mask 204, a third layer mask 206, a fifth layer mask 212, a sixth layer mask 214, and an eighth layer mask 220 that are multiple technology node masks (MTM). The mask set 200 further includes a fourth layer masks 208 and 210 and seventh layer masks 216 and 218. The masks 208, 210, 216, and 218 are single technology node masks (STM). The MTMs (202, 204, 206, 212, 214, 220) each include the first and second pattern associated with the referenced layer (mask layer). For example, the first pattern may be associated with a 65 nm technology node and the second pattern may be associated with a 90 nm technology node. The first layer mask 202, the second layer mask 204, the third layer mask 206, the fifth layer mask 212, the sixth layer mask 214, and the eighth layer mask 220 each include the first pattern (or portion thereof) and the second pattern (or portion thereof) and therefore, include patterns associated with the first technology node and the second technology node. The fourth layer mask 208 is a STM and includes the first pattern (or portion thereof) and the fourth layer mask 210 is a STM and includes the second pattern (or portion thereof). Therefore, the mask 208 and 210 each include patterns associated with a single technology node. For example, the fourth layer mask 208 may be associated with a 65 nm technology node, and the fourth layer mask 210 may be associated with a 90 nm technology node. The mask set 200 is exemplary only and not intended to be limiting. In other embodiments, a mask set may include any plurality of mask, any plurality of MTM, and any plurality of STM, including, for example, mask layers including one or more MTM and one or more STMs. In an alternative embodiment, the mask set 200 may include multiple device masks and single device masks in addition to, or in lieu of MTMs and STMs. Multiple device masks are described in further detail below, for example, with reference to FIG. 12.

As described in greater detail below, in an example, the mask set 200 may be used to fabricate a device including the first pattern, and a device including the second pattern. The devices may be distinct integrated circuits, products, and/or associated with different customers. The two devices may be associated with two different technology nodes. To fabricate a device including the first pattern on a wafer, the photolithography process may use masks 202, 204, 206, 208, 212, 214, 216, and 220. To fabricate a device including the second pattern on a wafer, the photolithography process may use the masks 202, 204, 206, 210, 212, 214, 218, and 220. In other words, for the incompatible layers (e.g., layer 4 and layer 7), only the STM associated with the device to be fabricated is used.

Referring again to FIG. 1, in an embodiment, for a given layer it is determined the patterns and/or technology nodes are incompatible. Being incompatible layers, a plurality of STMs are required for forming the layers, one mask for each of the first and second patterns. The method 100 then proceeds to step 108*a* where mask data is provided that includes the first pattern that is associated with the first technology node and step 108*b* where mask data is provided that includes the second pattern that is associated with the second technology node. The mask data may include any representation of the pattern, or portion thereof. The steps 108*a/b*, as well as the steps that follow, provide for substantially similar processing of mask data and as such are referenced as step 1*xxa* for mask data including the first pattern and a corresponding step 1*xxb* for mask data including the second pattern. In the embodiment, the method 100 proceeds such that two distinct STM are formed (e.g., in step 116*a* and 116*b* respectively); a first STM includes the pattern associated with the first technology node, and a second STM includes the pattern and associated with the second technology node. The steps 1*xxa* and 1*xxb* may occur contemporaneously or at distinct times and may provide for distinct manipulation of mask data, for example, using different inputs (e.g., to simulation programs), structures, parameters, and the like. After step 108*a*/108*b*, the method 100 then proceeds to step 110*a*/110*b* where a dummy pattern is placed on each STM. The dummy pattern may be placed in the unused portion of a mask. The unused portion includes the area of the mask where the alternate pattern(s) would be formed. For example, in a mask set associated with a first technology node of 80 nm and a second technology node of 90 nm, a STM associated with the 80 nm technology node may include a dummy pattern in a portion of the mask that would be used to form the 90 nm pattern. The placement of the dummy pattern may provide for avoiding a loading effect during an exposure process using the mask.

Figure 3:
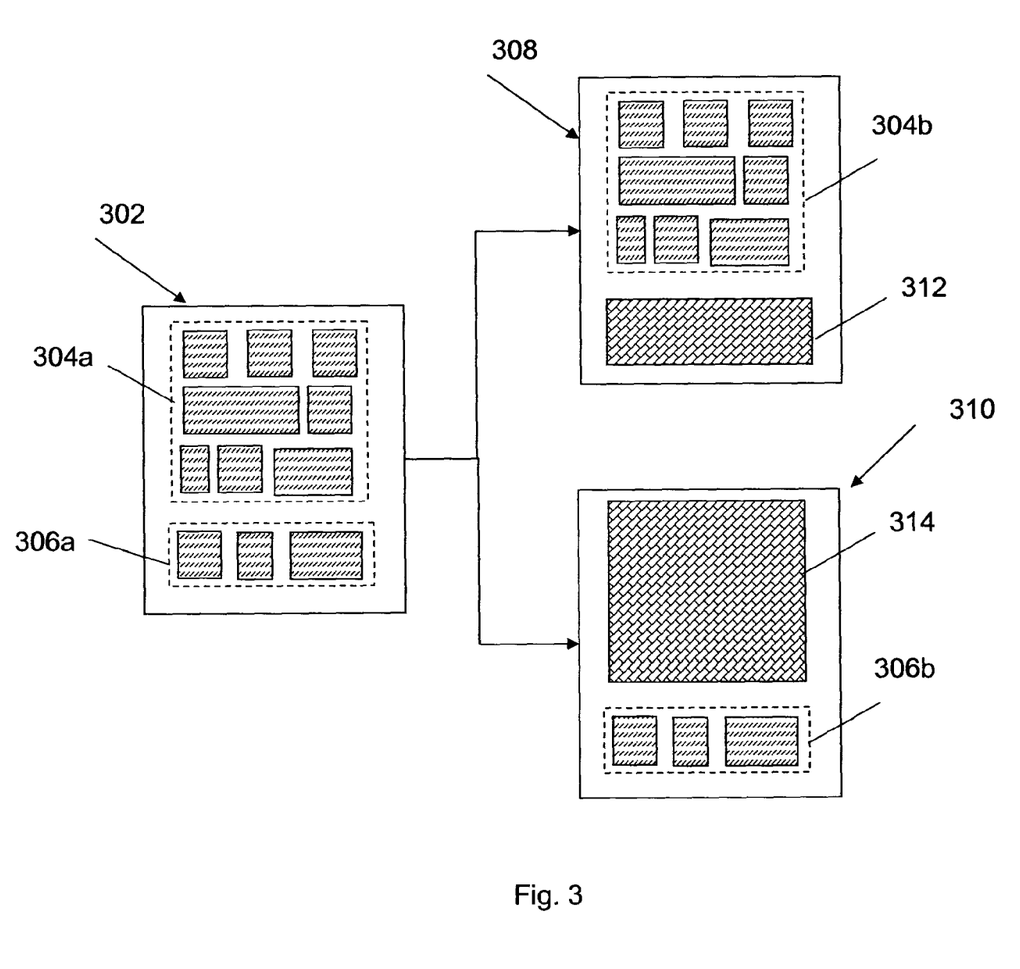
FIG. 3 is a top view illustrating embodiments of photomasks.

FIG. 3 illustrates the placement of dummy pattern (e.g. dummy features). An MTM 302 is illustrated including a first pattern 304*a* and a second pattern 306*a*. The first pattern 304*a* may be associated with a different technology node than the second pattern 306*a*. A first STM 308 and a second STM 310 are also illustrated. The STM 308 includes a first pattern 304*b* and a first dummy pattern 312. The STM 310 includes a second pattern 306*b* and a second dummy pattern 314. The MTM 302, the STM 308, and the STM 310 may be included in the same mask set and provide for the same and/or different mask layers. For example, the MTM 302 may provide for a different mask layer than the STMs 308 and 310, which may provide for the same mask layer (e.g., contact, interconnect, active), but provide a pattern. The MTM 302 and STMs 308 and 310 may be included in a mask set substantially similar to as described above with reference to the mask set 200 in FIG. 2.

The first pattern 304a and the first pattern 304b may be associated with the same pattern (e.g., device or plurality of devices) but provide for different layers to be formed on the substrate. For example, the first pattern 304a may provide for a contact layer of a pattern, and the first pattern 304b may provide for an interconnect layer of the pattern. The second patterns 306a and 306b may also be associated with the same pattern provide for formation of different layers of the pattern. By way of example only, in an embodiment, the first patterns 304a and 304b are associated with an 80 nm technology node and the second patterns 306a and 306b are associated with a 90 nm technology node.

Returning to FIG. 1, the method 100 proceeds to step 112a/112b where process control structures associated with each process technology node are included in the relevant mask data. The process control structures include test keys and process monitor cells. Test keys and/or process monitor cells may include circuits formed on the substrate adjacent to a device that are operable to be measured at one or more points during or after fabrication. The process control structures included in step 112a may be different from those included in step 112b.

The method 100 proceeds to step 114a/114b where mask data preparation is performed. The mask data preparation may include resolution enhancement techniques (RET) including optical proximity correction (OPC), simulations including process simulations, and/or other mask data preparation techniques including design for manufacturability processes. The mask data preparation includes generation of a mask image (e.g., pattern) to be fabricated on a mask, for one or more mask layers. For example, the mask data preparation may include transforming the polygons that make up the patterns (e.g., a provided in a GDSII format) into a form that may be written to a mask. The mask data preparation tools and input to such tools may depend up on the technology node with which the pattern is associated. For example, processes of different technology nodes may include different simulations as materials, tools, process recipes, and/or process control may vary between processes, OPC rules may be different for different technology nodes, and/or other variations that may be determined. Mask data preparation is also described below with reference to step 122.

The method 100 then proceeds to step 116a/116b where each of the STM masks are fabricated. The masks may be any mask type such as, a binary mask, a phase shift mask, an attenuated phase-shift mask (Att-PSM), an alternating aperture phase shift mask (Alt-PSM), a chromeless phase shift mask (CPL), and/or other possible mask types. The masks include a substrate; the substrate may be a transparent substrate such as fused silica ($SiO_2$), or quartz, relatively free of defects, calcium fluoride, or other suitable material. The masks may include attenuating material including chrome or other materials such as, Au, MoSi, CrN, Mo, $Nb_2O_5$, Ti, Ta, $MoO_3$, MoN, $Cr_2O_3$, TiN, ZrN, $TiO_2$, TaN, $Ta_2O_5$, NbN, $Si_3N_4$, ZrN, $Al_2O_3N$, $Al_2O_3R$, or a combination therefore. The masks may include one or more areas of etched substrate, such as provided by an HF etchant.

Figure 4:
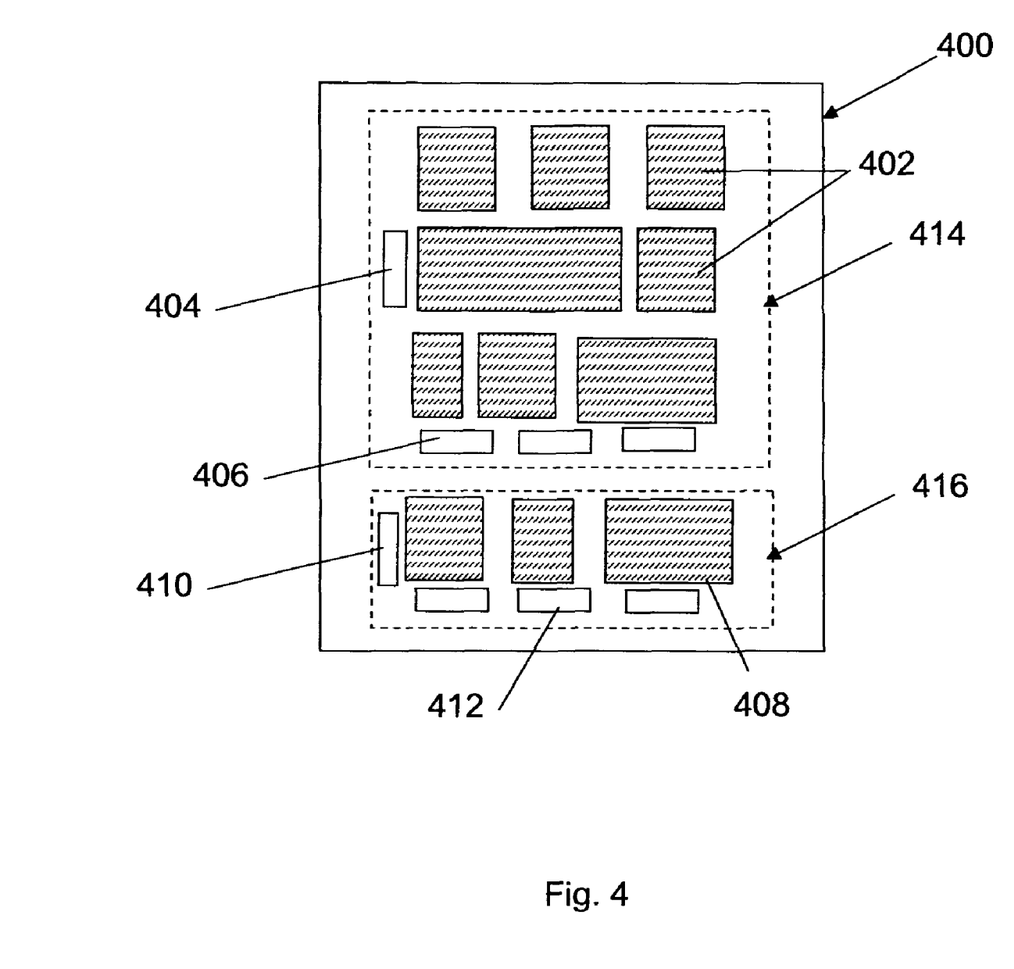
FIG. 4 is a top view illustrating an embodiment of a multiple technology node mask including process control features.

Returning to step 106, in an embodiment of the method 100, it is determined that a multi-technology node mask (MTM) is suitable for a given mask layer (e.g., the patterns are compatible for the mask layer). The MTM to be fabricated includes the first pattern and the second pattern associated with a mask layer. As such, the MTM includes features associated with a first technology node and features associated with a second technology formed on the same mask substrate. The method 100 proceeds to step 118 where mask data including a pattern associated with a first technology node and a pattern associated with a second technology is provided. The method 100 then proceeds to step 120 where process control structures are provided (e.g., included in the mask data). The process control structures include test keys and process monitor cells. Test keys and/or process monitor cells may include circuits formed on the substrate adjacent to a device that are operable to be measured at one or more points during or after fabrication. A test key may provide, for example, one or more features for which a resistivity is measured. A process monitor cell may provide, for example, for measurement of a timing delay. The process control structures may be fabricated in a saw street, frame, within a device, and/or elsewhere on the substrate. Process control structures typically differ between technology nodes. In a MTM including patterns of a first technology node and a second technology node, process control structures associated with each of the first and second technology nodes may be provided. FIG. 4 illustrates an MTM 400 including a first pattern 402, a first set of process control structures including process monitor cells 404 and test keys 406, a second pattern 408, and a second set of process control structures including process monitor cells 410 and test keys 412. The mask portion 414 defines an area of the MTM 400 including features (e.g., patterns, process monitor cells, test keys) associated with a first technology node and the mask portion 416 defines an area of the MTM 400 including features associated with a second technology node. A frame may surround each of the mask portion 414 and the mask portion 416. The second technology node may differ in geometry from the first technology node.

Returning to FIG. 1, the method 100 proceeds to step 122 where mask data preparation is performed. The mask data preparation may include resolution enhancement techniques (RET) including optical proximity correction (OPC), simulations including process simulations, and/or other mask data preparation techniques including design for manufacturability processes. The mask data preparation includes generation of a mask image (e.g., pattern) to be fabricated on a mask for one or more mask layers. For example, the mask data preparation may include transforming the polygons that make up the patterns (e.g., a provided in a GDSII format) into a form that may be written to a mask. The mask data preparation tools (e.g., software) and input to such tools may depend up on the technology node with which the pattern is associated. For example, processes of different technology nodes may include different simulations as materials, tools, process recipes, and/or process control may vary between processes, OPC rules may be different for different technology nodes, and/or other variations that may be determined.

Figure 5:
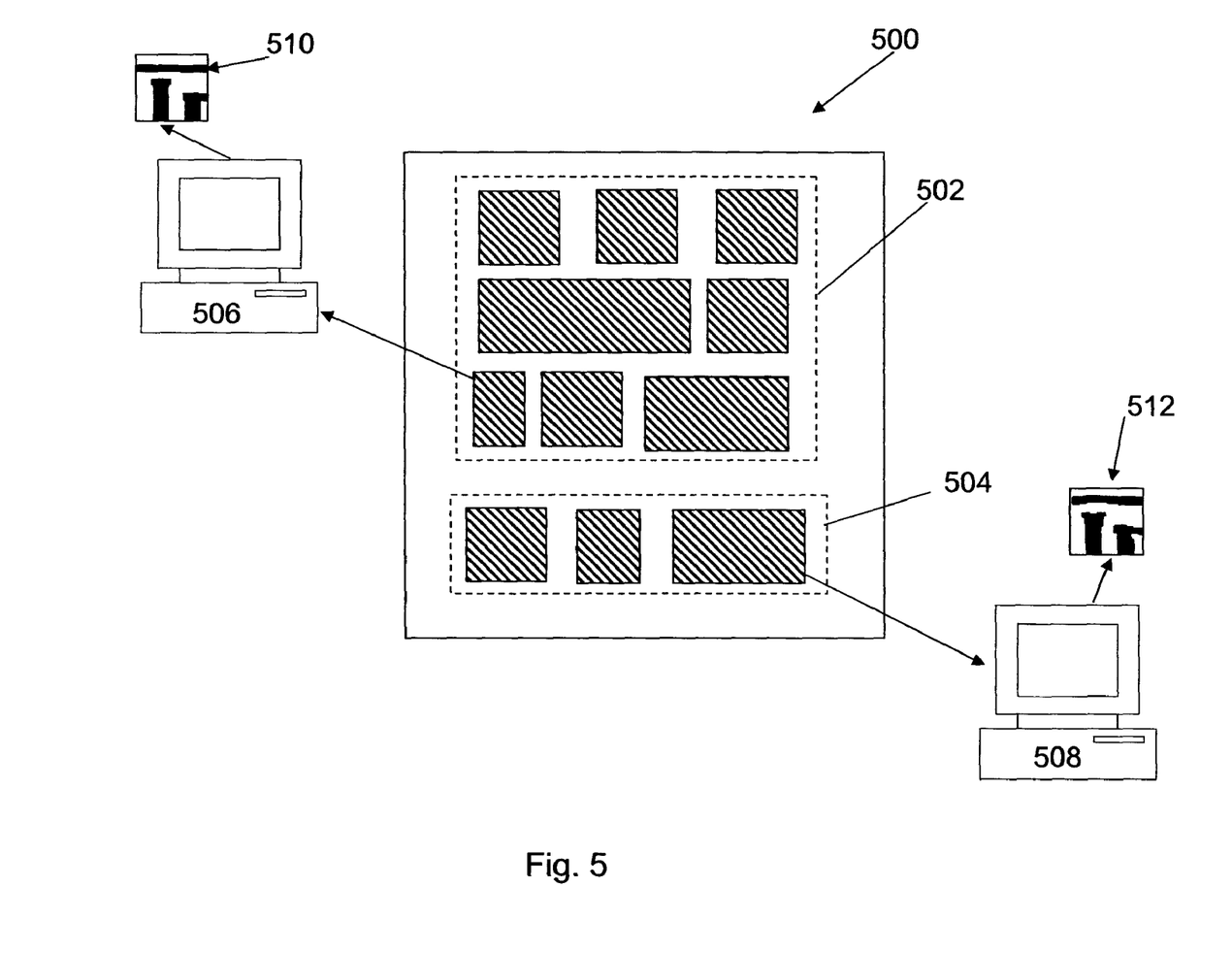
FIG. 5 is a block diagram illustrating an embodiment of a system for mask data preparation.

Mask data preparation techniques associated with a technology node are used to prepare the mask data associated with that technology node. For example, in an embodiment, a first pattern may be associated with an 80 nm process and a second pattern associated with a 90 nm, both patterns to be formed on a single substrate of an MTM. Mask data preparation tools associated with the 80 nm (e.g., a sub-node of a 90 nm process) will be used to prepare the first pattern and mask data preparation tools associated with the 90 nm process will be used to prepare the second pattern. FIG. 5 illustrates such an embodiment. A MTM 500 is illustrated including a first portion 502 associated with a first technology node and a second portion 504 associated with a second technology node. A computer 506 performs mask data preparation for the first portion 502; a computer 508 performs mask data preparation for the second portion 504. Though illustrated as distinct tools, computer 506 and 508 may be a single tool (e.g., computer, software program, or the like). The computer 506 and 508 illustrate the distinct mask data preparation that may be performed (e.g., simulations ran, variables/inputs used in simulation and/or other mask preparation tools, OPC rules, and the like). The pattern 510, associated with the first technology node, and a pattern 512, associated with the second technology node, illustrate that a substantially similar pattern (e.g., feature) provided in step 118 may provide for different patterns to be formed on the mask because of the mask data preparation variations between technology nodes. For example, differences in edge shifts required by RET provide for different mask patterns. By way of example, the pattern 510 may represent a pattern generated by an OPC recipe for a first technology node (e.g., 90 nm), and the pattern 512 may represent a pattern generated by an OPC recipe for a second technology node (e.g., 80 nm).

The computers 506 and 508 may include electronic design automation (EDA) tool(s). The computers 506 and 508 may also be operable to execute one or more other steps of the method 100 including determining compatibility of layers, providing STMs, and providing an MTM. The computers 506 and 508 include computer-readable medium that may contain computer-executable instructions. The computers 506 and 508 include hardware capable of executing machine-readable instructions as well as the software for executing acts (typically machine-readable instructions) that produce a desired result. Software includes any machine code stored in any memory medium, such as RAM or ROM, and machine code stored on other storage devices (such as floppy disks, flash memory, or a CD ROM, for example). Software may include source or object code, for example. In additional software encompasses any set of instructions capable of being executed in a client machine or server. Any combination of hardware and software may comprise a computer system. The codes, executed by a computer, may include code for mask data preparation including performing process simulations, RET, OPC, fracturing or other manners of transferring received mask data to a format suitable for writing onto a mask. The computers 506 and 508 may be configured to store process information specific to one or more process technology nodes, for example, design rules, material properties, tool settings, and the like that may be used in the mask data preparation procedures. Computer readable mediums include passive data storage, such as RAM as well as semi-permanent data storage such as a compact disk read only memory (CD-ROM). Data structures are defined organizations of data that may enable an embodiment of the present disclosure. For example, a data structure may provide an organization of data, or an organization of executable code.

Returning to FIG. 1, the method 100 then proceeds to step 124 where a MTM is fabricated. The MTM may include a single substrate upon which features associated with the first technology and the second technology node are formed. An MTM may include any plurality of technology nodes. The MTM may include a mask type such as, a binary mask, a phase shift mask, an attenuated phase-shift mask (Att-PSM), an alternating aperture phase shift mask (Alt-PSM), a chromeless phase shift mask (CPL), and/or other possible mask types. The substrate may be a transparent substrate such as fused silica ($SiO_2$), or quartz, relatively free of defects, calcium fluoride, or other suitable material. The MTM may include attenuating material including chrome or other materials such as, for example, Au, MoSi, CrN, Mo, $Nb_2O_5$, Ti, Ta, $MoO_3$, MoN, $Cr_2O_3$, TiN, ZrN, $TiO_2$, TaN, $Ta_2O_5$, NbN, $Si_3N_4$, ZrN, $Al_2O_3N$, $Al_2O_3R$, or a combination therefore. The MTM may include one or more areas that include etched substrate, such as provided by an HF etchant. The MTM may be substantially similar to, for example, MTMs of FIG. 2, the MTM 500 of FIG. 5, and/or the MTM 400 of FIG. 4.

In an embodiment, the method 100 returns to step 106 where compatibility is determined for an additional mask layer associated with the patterns provided in steps 102 and 104. The method 100 continues such that, by the formation of two or more mask layers (e.g., MTM or STMs), a mask set is provided in step 126. The mask set 126 may include any number of MTMs and/or STMs. The mask set provided may be substantially similar to the mask 200, described above with reference to FIG. 2.

The method 100 then proceeds to step 128 where a pattern is exposed on one or more substrates (e.g., wafers) during a photolithography process using the mask set, or portion thereof, provided in step 126. The mask set may be used, for example, to provide a wafer with both the first and second pattern formed thereon, a wafer with the first pattern and not the second pattern formed thereon, and/or a wafer with the second pattern and not the first pattern formed thereon. Techniques that may be useful in exposing only one of a plurality of patterns formed on a photomask (e.g., reticle) are provided in U.S. Pat. No. 6,040,892 to Pierrat, the contents of which are hereby incorporated by reference. In an embodiment, a moveable aperture (e.g., shutter) is used to prevent exposure of a pattern (e.g., a pattern included on an MTM) onto a wafer.

Figure 6:
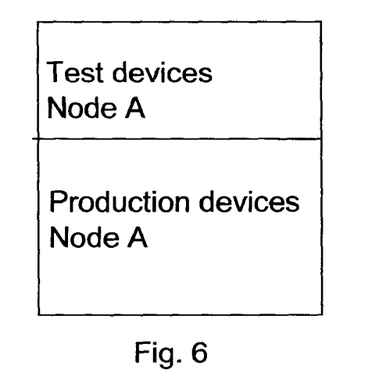
FIGS. 6, 7, 8, 9, 10, and 11 are top views illustrating a plurality of embodiments of multiple technology node masks.
Figure 7:
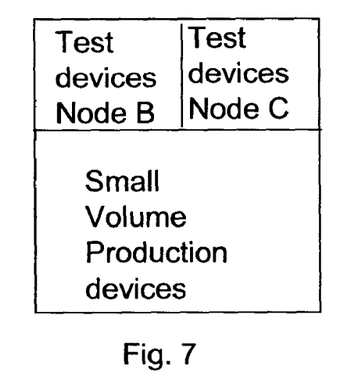
Figure 8:
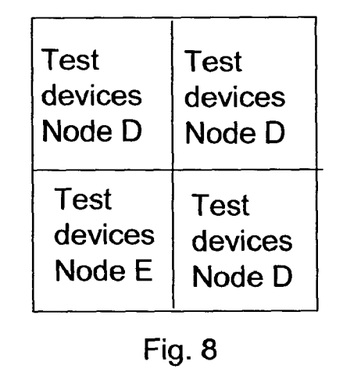
Figure 9:
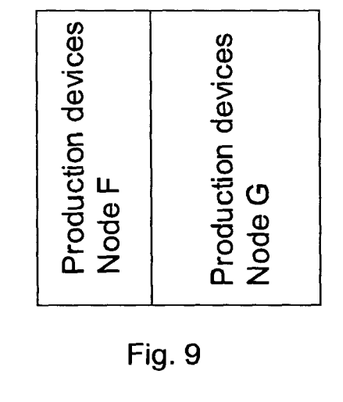
Figure 10:
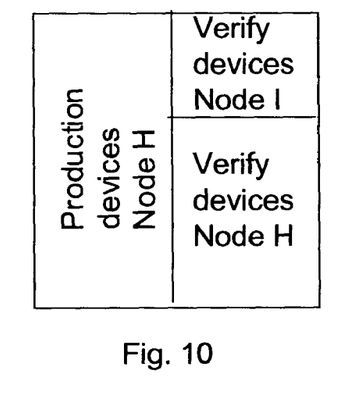
Figure 11:
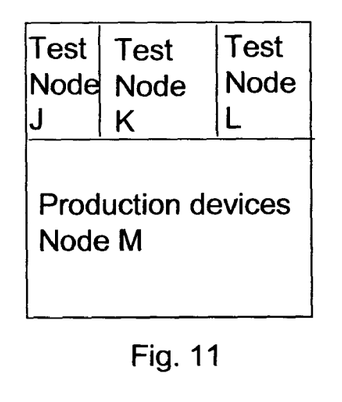

Though the method 100 is illustrated herein as providing two patterns each associated with a different technology node, any combination and quantity of technology nodes, patterns, devices, products, customers, and/or applications is possible. FIGS. 6, 7, 8, 9, 10, and 11 illustrate a plurality of embodiments of masks that may be provided using one or more of the steps provided in FIG. 1. The embodiments provided in FIG. 6 are exemplary only and not intended to be limiting in any manner. Each mask includes a plurality of frames (e.g., an area defining a portion of the mask within which a pattern is formed) and within the frame a technology and application for the patterns (e.g., devices) formed therein is referenced. Examples of the technology nodes include 130 nm, 110 nm, 90 nm, 80 nm, 65 nm, 55 nm, 45 nm, 32 nm, 22 nm and other technology nodes known or later developed in the art.

Figure 12:
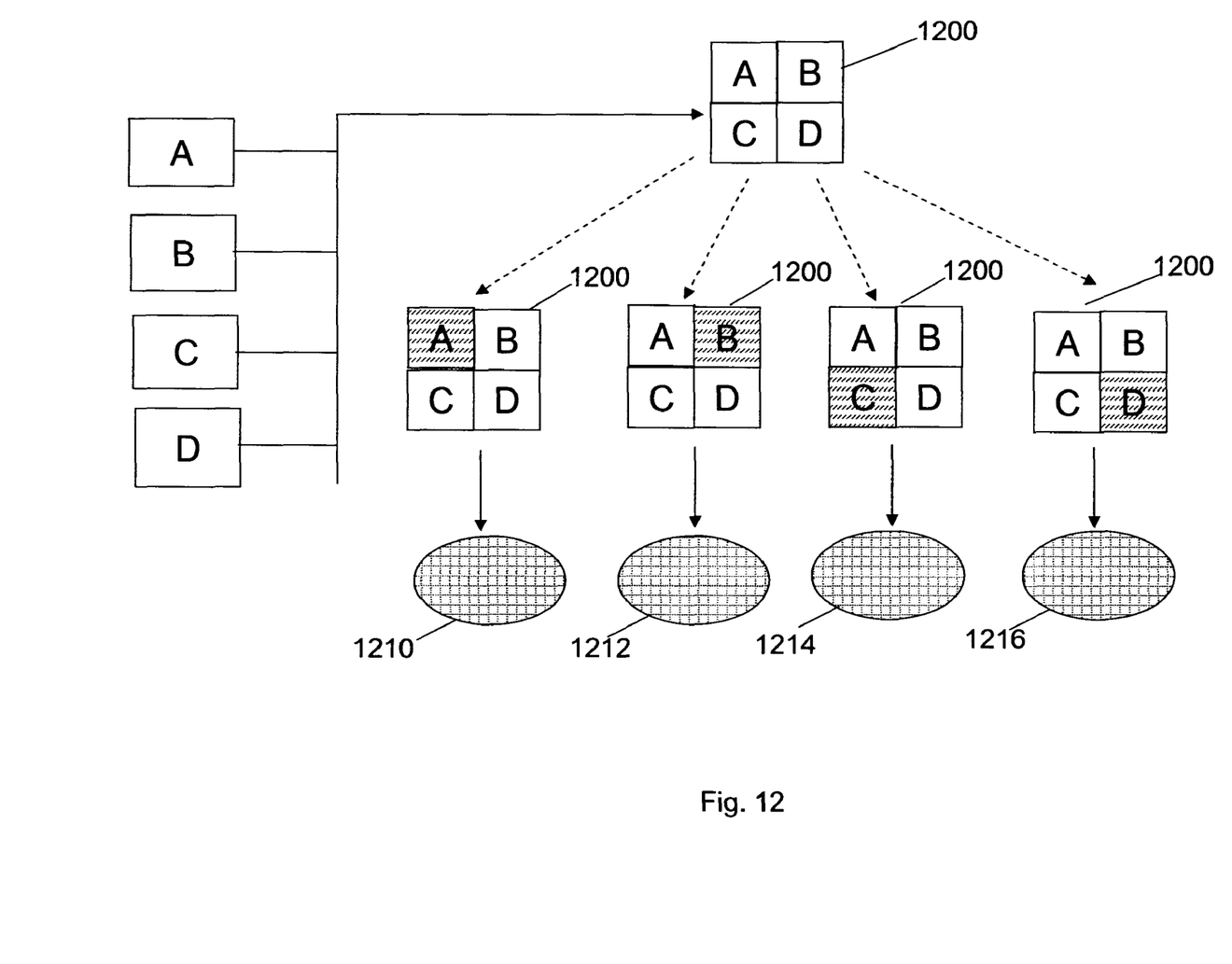
FIG. 12 is a block diagram illustrating an embodiment of fabrication of devices using a multiple technology node mask.

In an embodiment, a multiple device mask is formed including four different patterns each associated with a different integrated circuit device. The patterns may include the same and/or different technology nodes, products types, and/or originate from the same or different customers. The multiple device mask may be formed in a substantially similar manner as described above with reference to the method 100 and the formation of a MTM. Using the disclosure provided herein, a single multiple device mask maybe used to expose each pattern on a distinct wafer. For example, FIG. 12 illustrates a pattern A, pattern B, pattern C, and pattern D. In an embodiment, pattern A, pattern B, pattern C, and pattern D are provided by a customer A, customer B, customer C, and customer D respectively. The patterns A, B, C, and D may be found to be compatible for at least one layer, such as described above with reference to step 106 of the method 100, illustrated in FIG. 1. For a compatible mask layer, pattern A, pattern B, pattern C, and pattern D are formed on a multiple device mask 1200. Lithography techniques, such as the use of a moveable aperture to prevent unwanted exposure, are used to expose the pattern A portion of the multiple device mask 1200 to form a plurality of device A on a wafer 1210. Likewise, pattern B of the multiple device mask 1200 is exposed to form a plurality of device B on a wafer 1212, pattern C of the multiple device mask 1200 is exposed to form a plurality of device B on a wafer 1214, and pattern D of the multiple device mask 1200 is exposed to form a plurality of device D on a wafer 1216. Thus, each wafer may be exclusively one device type (e.g., device A, device B, device C, or device D). Such a fabrication system may be useful to a semiconductor foundry supplier providing the supplier a manner in which to provide distinct wafers to a plurality of customers, while incurring costs for a single mask.

Numerous other embodiments applying the systems and methods described herein are possible. For example, patterns associated with a first and second technology node may be formed on the same mask and fabricated on different wafers, a plurality of devices may be formed on the same mask and each device fabricated on a different wafer, a plurality of patterns including patterns from at least two different customers may be formed on the same mask and fabricated on different wafers, a plurality of patterns each having a different application may be formed on the same mask and each pattern fabricated on a different wafer (e.g., a production pattern and a development pattern), and numerous other combinations thereof.

Thus provided is a multiple technology node mask including patterns associated with multiple technology nodes (e.g., patterns associated with a first technology node and patterns associated with a second technology node). The MTM is formed using compatible patterns. Incompatible patterns are provided on a plurality of STMs. Dummy patterns are placed on the STM in order to reduce the mask loading effect. Process monitor cells and test keys associated with each of the multiple technology nodes are placed on the MTM. Mask data preparation such as simulation, RET, and the like are performed for patterns of each technology node separately. In other embodiments, in addition to, or in lieu of multiple technology nodes being included on a mask, multiple device types may be included on the mask each being associated with the same or a different technology node.

The mask set including a MTM may allow for substantial savings in mask fabrication costs. The mask set including a MTM may also be useful for providing mask shuttles, for example, to one or more customers of a semiconductor foundry supplier. The combination of technology nodes may allow for increased frequency for mask shuttles, decreased cost, increased utilization of mask shuttles, combination of sub-node and main-node process such that sub-node processes may be offered with more frequency, and/or other advantages. Similar advantages may be experienced from the formation of a multiple device mask.

Although only a few exemplary embodiments of this invention have been described in detail above, those skilled in the art will readily appreciate that many modifications are possible in the exemplary embodiments without material departing from the novel teachings and advantages of this disclosure.

Thus, provided is a photolithography device (e.g., a photomask, reticle, or mask set). The device includes a substrate. The substrate includes a first pattern and a second pattern. The first pattern is associated with a first technology node. The second pattern is associated with a second technology node. The first and second technology nodes may be different. In an embodiment, the first technology node is a main node, and the second technology node is a sub-node.

Also provided is a method of providing a mask set. The method includes providing mask data including a first pattern and a second pattern. The first pattern is associated with a first technology node. The second pattern is associated with a second technology node. A multiple technology node mask is formed for a first mask layer and includes features associated with the first pattern and features associated with the second pattern. In an embodiment, for another mask layer associated with the mask data, it is determined to form a plurality of single technology masks.

Further provided is a method of fabricating semiconductor devices. The method includes providing a mask wherein the mask includes a first pattern and a second pattern. The first pattern is associated with a first integrated circuit (IC) device. The second pattern is associated with a second IC device. The mask is irradiated which provides for formation of the first pattern on a first wafer. The mask is irradiated again and provides for formation of the second pattern on a second wafer.

What is claimed is:

1. A photolithography device, comprising:
a first masking having a first substrate;
a first pattern formed on the first substrate, wherein the first pattern is associated with a first technology node; and
a second pattern formed on the first substrate, wherein the second pattern is associated with a second technology node, and wherein the first technology node differs from the second technology node.

2. The device of claim 1, wherein the first technology node is a main node, and wherein the second technology node is a sub-node.

3. The device of claim 1, wherein the first pattern is associated with a first customer and the second pattern is associated with a second customer.

4. The device of claim 1, further comprising:
a third pattern formed on the first substrate, wherein the third pattern is associated with a third technology node, and wherein the first technology node differs from the third technology node.

5. The device of claim 1, wherein the first substrate is selected from the group consisting of a binary mask, a phase-shift mask (PSM), a phase shift mask, an attenuated phase-shift mask (Att-PSM), an alternating aperture phase shift mask (Alt-PSM), and a chromeless phase shift mask (CPL).

6. The device of claim 1, further comprising:
a first process control structure associated with the first technology node formed on the first substrate; and
a second process control structure associated with the second technology node formed on the first substrate.

7. The device of claim 1, further comprising:
a second mask having a second substrate and a third mask having a third substrate;
a third pattern formed on the second substrate, wherein the third pattern is associated with the first technology node; and
a fourth pattern formed on the third substrate, wherein the fourth pattern is associated with the second technology node.

8. The device of claim 7, further comprising:
a first dummy pattern formed on the second substrate; and
a second dummy pattern formed on the third substrate.

9. The device of claim 1, wherein the first technology node is approximately 90 nm or less, and wherein the second technology node is approximately 65 nm or less.

10. A method of fabricating semiconductor devices, the method comprising:
providing a first mask wherein the first mask includes a first pattern and a second pattern, wherein the first pattern is associated with a first integrated circuit (IC) device, and the second pattern is associated with a second IC device;

providing a first irradiation of the first mask, wherein the first radiation forms the first pattern on a first wafer; and providing a second irradiation of the first mask, wherein the second radiation forms the second pattern on a second wafer.

11. The method of claim 10, wherein the providing the first irradiation of the first mask includes preventing the formation of the second pattern on the first wafer.

12. The method of claim 11, wherein the first pattern is associated with a first technology node and the second pattern is associated with a second technology node.

13. The method of claim 10, wherein the first pattern is associated with a first customer, and wherein the second pattern is associated with a second customer.

14. The method of claim 13, wherein the first customer is at least one of a fabless and an integrated device manufacturer (IDM) customer.

15. A photolithography device, comprising:
a multi-technology node mask (MTM) for forming features on a first layer of a semiconductor device, wherein the MTM includes features associated with a first pattern and features associated with a second pattern, wherein the first pattern is associated with a first technology node and the second pattern is associated with a second technology node;
a first single technology node mask (STM) for forming features on a second layer of the semiconductor device, wherein the first STM includes features associated with the first pattern; and
a second STM for forming features on the second layer of the semiconductor device, wherein the second STM includes features associated with the second pattern.

16. The photolithography device of claim 15, wherein the first STM includes a first dummy pattern and the second STM includes a second dummy pattern.

17. The photolithography device of claim 15, wherein the MTM includes a first process control monitor (PCM) feature associated with the first technology node and a second process control monitor (PCM) feature associated with the second technology node.

18. The photolithography device of claim 15, wherein at least one of the features on the first layer of the semiconductor device is selected from the group consisting of a well, an active area, a contact, and an interconnect.

19. The photolithography device of claim 15, wherein the MTM is selected from the group consisting of a binary mask, a phase-shift mask (PSM), a phase shift mask, an attenuated phase-shift mask (Att-PSM), an alternating aperture phase shift mask (Alt-PSM), and a chromeless phase shift mask (CPL).

20. The photolithography device of claim 15, wherein the first technology node is a main node and the second technology node is a sub-node.

* * * * *